(12) United States Patent
Kohler et al.

(10) Patent No.: US 8,405,412 B2
(45) Date of Patent: Mar. 26, 2013

(54) INTEGRATED CIRCUIT SELF-MONITORED BURN-IN

(75) Inventors: Ross A. Kohler, Allentown, PA (US); Richard J. McPartland, Nazareth, PA (US); Larry Christopher Wall, Fogelsville, PA (US); Wayne E. Werner, Coopersburg, PA (US)

(73) Assignee: LSI Corporation, Milpitas, CA (US)

( * ) Notice: Subject to any disclaimer, the term of this patent is extended or adjusted under 35 U.S.C. 154(b) by 738 days.

(21) Appl. No.: 12/431,053

(22) Filed: Apr. 28, 2009

(65) Prior Publication Data

US 2010/0271064 A1    Oct. 28, 2010

(51) Int. Cl.
*G01R 31/3187* (2006.01)
*G01R 31/00* (2006.01)

(52) U.S. Cl. ............................... 324/750.3; 324/750.05
(58) Field of Classification Search .................. None
See application file for complete search history.

(56) References Cited

U.S. PATENT DOCUMENTS 5,504,369 A * 4/1996 Dasse et al. .................. 257/620
2002/0190742 A1* 12/2002 Ooishi ........................... 324/763

* cited by examiner

*Primary Examiner* — Paresh Patel
(74) *Attorney, Agent, or Firm* — Ryan, Mason & Lewis, LLP

(57) ABSTRACT

An IC adapted for self-monitored burn-in includes a first memory and at least one BIST circuit coupled to the memory and operative to test the IC by executing a burn-in test and to generate test results indicative of at least one parameter of the burn-in test. The test results are at least temporarily stored in the first memory as a function of a first control signal.

18 Claims, 3 Drawing Sheets

INTEGRATED CIRCUIT SELF-MONITORED BURN-IN

FIELD OF THE INVENTION

The present invention relates generally to integrated circuits, and more particularly relates to integrated circuit testing.

BACKGROUND OF THE INVENTION

Integrated circuits (ICs) are ubiquitous in the modem electronic age, found in a wide variety of applications and products, including household appliances, consumer electronics, communications systems, automotive systems, etc. As dependence on ICs has increased, the reliability of these devices has become increasingly critical. Thus, an important objective of IC designers and manufacturers is to produce an electronic component and/or system having a high degree of reliability, an essential attribute for gauging the quality of electronic components and systems. Moreover, both manufacturers and customers of ICs strive to define and predict such reliability in a cost-effective manner.

ICs are subject to what is often referred to as infant mortality failures. Infant mortality failures are those failures that are associated with a wear-out mechanism causing device failure within a relatively short period of operating time, far below a predicted mean time before failure (MTBF) for the device (e.g., within six months of operation). Dynamic random access memory (DRAM) is particularly prone to infant mortality failures which may be attributable to, for instance, storage cell capacitor dielectric failure.

ICs containing DRAM, for example, commodity DRAM ICs and logic ICs with embedded DRAM (eDRAM), are also subject to variable-hold-time (VHT) failures. Hold time is typically defined as an amount of time that a DRAM will retain data without being refreshed. Minimum hold time is usually specified by a DRAM manufacturer and is typically somewhere between 10 microseconds (µs) and 10 milliseconds (ms). A hold time failure can occur when one or more storage cells (in one or more respective memory cells) leaks charge so fast that it loses data before the next scheduled refresh. A hold time failure is typically caused by a fault in the cell capacitor dielectric which leaks charge from the cell storage capacitor. This type of hold time failure is typically a hard failure. A hard failure is one that reoccurs repeatedly.

VHT failures are associated with changes, over time, of the hold time of a cell, such as, for example, variations in hold time wherein the hold time changes from an acceptable or passing value, to a failing value, and back to a passing value. A VHT failure is essentially a hold time failure that occurs intermittently. It may occur so infrequently that it may not be caught at a manufacturer IC testing stage, but may fail intermittently in a customer application. Failures that occur intermittently are often termed soft failures. Soft failures are a troublesome source of IC quality issues.

In order to segregate ICs having VHT failures from ICs that do not, it is typically necessary to perform continuous testing for extended periods of time and under various operational conditions (e.g., supply voltage, temperature, clock speed, etc.), also known as burn-in testing. In this way, many intermittent failures can be detected and yield can be advantageously improved by eliminating ICs exhibiting such intermittent failures. However, the more complex and rigorous the post-manufacturing testing becomes, the higher the cost of the testing, which is undesirable.

SUMMARY OF THE INVENTION

Illustrative embodiments of the present invention provide, for example, apparatus, methods and techniques for ensuring high quality ICs without incurring the relatively high cost of performing monitored burn-in. For example, ICs containing DRAM memory can be screened for intermittent failures, such as VHT failures, without performing burn-in using high cost monitored burn-in equipment. Advantages of the invention include, for example, the use of non-monitored burn-in equipment for performing monitored burn-in of ICs.

In accordance with one aspect of the invention, an IC adapted for self-monitored burn-in is provided. The IC comprises a first memory and at least one built-in self-test (BIST) circuit coupled to the memory and operative to test the IC by executing a burn-in test and to generate test results indicative of at least one parameter of the burn-in test. The test results are at least temporarily stored in the first memory as a function of a first control signal.

In accordance with another aspect of the invention, a method for self-monitored burn-in of an IC is provided. The method comprises executing a burn-in test of the IC to generate test results indicative of at least one parameter of the burn-in test; and storing at least a portion of the test results in a first memory in the IC, wherein the IC comprises a BIST circuit coupled to the first memory and operative to execute the burn-in test.

In accordance with yet another aspect of the invention, a semiconductor structure is provided which includes a first IC die and at least a second IC die mechanically mounted proximate to and electrically interconnected with the first integrated circuit die. At least one of the first and second IC die includes a circuit adapted for self-monitored burn-in comprising a first memory and at least one BIST circuit coupled to the memory. The BIST circuit is operative to test the IC by executing a burn-in test and to generate test results indicative of at least one parameter of the burn-in test, wherein the test results are at least temporarily stored in the first memory as a function of a first control signal.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate similar elements throughout the several views of the drawings, and wherein.

DETAILED DESCRIPTION OF THE INVENTION

Figure 1:
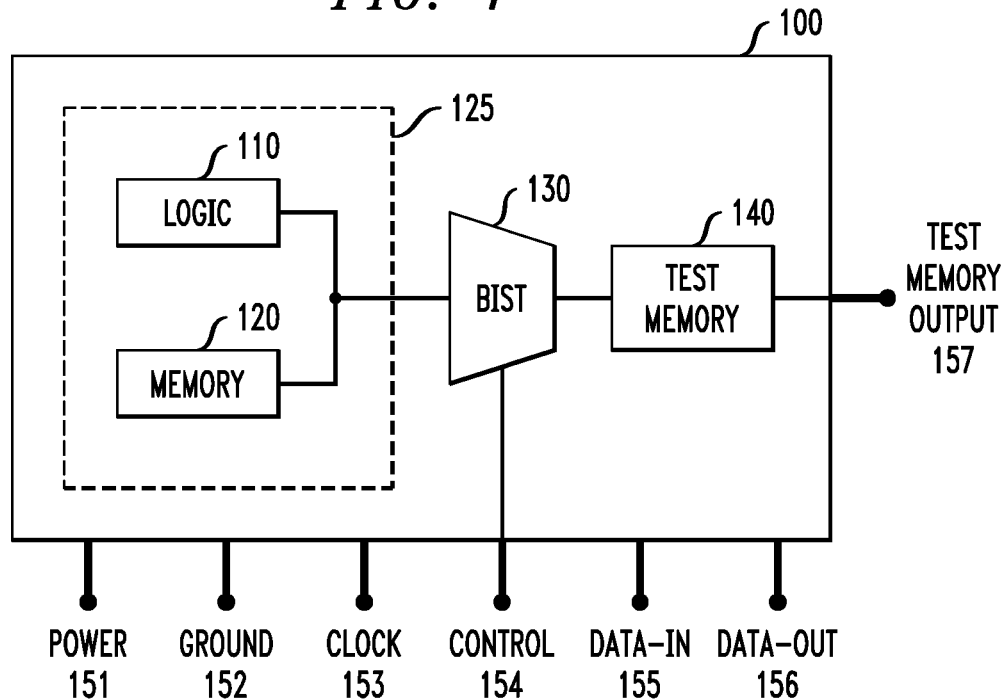
FIG. 1 is a block diagram depicting an exemplary IC adapted for performing self-monitored burn-in, according to an embodiment of the present invention.

The present invention will be described herein in the context of illustrative embodiments of an IC including embedded memory and being operative to perform self-monitored burn-in. It is to be appreciated, however, that the techniques of the present invention are not limited to the specific circuits and method shown and described herein. Rather, embodiments of the invention are directed broadly to improved techniques for ensuring high quality ICs without incurring the relatively high cost of performing externally monitored burn-in. For this reason, numerous modifications can be made to these embodiments and the results will still be within the scope of the invention. Moreover, although preferred embodiments of the invention are preferably fabricated in a silicon wafer, embodiments of the invention can alternatively be fabricated in wafers comprising other materials, including but not limited to Gallium Arsenide (GaAs), Indium Phosphide (InP), etc. No limitations with respect to the specific embodiments described herein are intended or should be inferred.

Burn-in testing, for example, is a process by which a population of ICs is exercised prior to being placed into service. The intention is to detect failing ICs within the initial, high-failure rate portion of a standard bathtub curve of reliability (e.g., an infant mortality period). If the burn-in period is made sufficiently long (and, optionally, stressful), there is a high likelihood that the remaining non-failing ICs will operate within the normal life portion of the bathtub curve (also known as the "useful life" period) once the burn-in process is complete. For ICs, burn-in is frequently conducted at stressful conditions (e.g., at elevated temperature and/or elevated voltage).

Typically, burn-in failures are associated with early failures (e.g. infant mortality failures). The failure rate over time then typically decreases to a relatively constant, low level for an extended period of time (e.g., about 10 years or more), according to the bathtub curve of reliability. The failure rate over time then increases sharply again, typically due to wear-out mechanisms (e.g., time-dependent dielectric breakdown, electromigration, trapping mechanisms, etc.) indicative of a wear-out portion of the bathtub curve of reliability. By stressing all devices for a certain burn-in time, devices exhibiting the highest failure rates will generally fail first and can be removed from the population of ICs. Thus, IC reliability typically increases at the expense of slightly decreased yield as a result of burn-in testing.

Some ICs, especially those including DRAM memory (e.g., eDRAM), often undergo burn-in testing to detect and remove devices exhibiting infant mortality failures. Typically, all, or a sampling, of a particular IC production lot will undergo burn-in. As previously stated, burn-in has a disadvantage of significantly increasing the cost of post-manufacturing IC testing. Typically, burn-in is done at a prescribed elevated temperature requiring specialized burn-in ovens and/or alternative equipment to house the ICs during burn-in testing. Multiple ICs generally undergo burn-in concurrently. The ICs are often mounted on specialized burn-in boards, each board holding many ICs, and many burn-in boards may be contained in a given burn-in oven.

Non-monitored burn-in may be defined herein as burn-in testing wherein ICs under test are operated (e.g., functionally exercised) during burn-in but are not continuously monitored for failures. Instead, the ICs are typically tested at multiple prescribed points in time (e.g., once per hour, or once per day). The ICs are withdrawn from the burn-in equipment at such prescribed time intervals and tested on standard automated test equipment (ATE). The number of test time intervals may be, for example, one or multiple (e.g., four). An illustrative non-monitored burn-in sequence may involve a 48-hour burn-in with test time intervals of 12, 24 and 48 hours. It is to be understood that the invention is not limited to any particular time interval size, nor is it limited to any particular number of testing intervals during the burn-in period.

Alternately, burn-in testing may be monitored, often referred to as monitored burn-in. During monitored burn-in, ICs are typically tested in situ; that is, the ICs are tested while mounted on specialized burn-in boards within burn-in ovens, typically, although not necessarily, at one or more prescribed elevated temperatures. During monitored burn-in, ICs can be tested as often as desired (e.g., continuously) after taking into account constraints such as, for example, cycle time, length of tests and the number of ICs to be tested. Because monitored burn-in equipment includes means for testing, for example test equipment similar in function to ATE, monitored burn-in equipment is often significantly more costly than non-monitored burn-in equipment. However, one advantage of monitored burn-in over non-monitored burn-in is the ability to detect intermittent failures in ICs primarily because frequent, or even continuous, testing is possible.

FIG. 1 is a block diagram depicting an exemplary IC operative for performing self-monitored burn-in, according to an embodiment of the present invention. The term self-monitored burn-in as used herein is intended to broadly refer to IC burn-in testing using non-monitored burn-in equipment, wherein the IC undergoing burn-in is adapted to perform self-test and to at least temporarily store (e.g., log) the test results. The self-test may be, for example, a burn-in test, although the invention is not limited to any particular test(s). The logged test results, which may be stored, for example, in one or more storage elements (e.g., registers, etc.) in the IC, do not need to be read at intermediate points in time; nor do the logged results necessarily need to be read by the burn-in equipment. Rather, test results can be read from the IC by external apparatus (e.g., downloaded by a general purpose computer) for subsequent analysis. The execution of the burn-in test during self-monitored burn-in is preferably adapted to detect infant mortality failures and to lower the post-burn-in failure rate of a population of ICs comprising the IC under test.

With reference to FIG. 1, IC 100 comprises several functional blocks, including a logic block 110, a memory block 120, a built-in self-test (BIST) block 130 and a test memory 140. It is to be appreciated that, although shown as separate functional blocks, some features of one block may be common with those of another block, such that at least a portion of one or more blocks may be combined with another block to form a block which incorporates the functions of the combined blocks. Access to and/or from the one or more functional blocks in the IC 100 is preferably provided by one or more input/output connections included in IC.

For example, external connections to IC 100 preferably include a power connection 151, which may be operative to convey VDD or an alternate voltage supply, and a ground connection 152, which may be operative to convey VSS or an alternate voltage return. IC 100 may include additional I/O connections for providing one or more signals to and/or for receiving one or more signals from the IC. Such additional I/O connections may include, for example, a clock connection 153 for conveying at least one clock signal to one or more functional blocks in the IC (e.g., logic block 110), at least one control connection 154 for conveying at least one control signal to one or more function blocks (e.g., BIST block 130), at least one data-in connection 155 for providing input data to the IC, and at least one data-out connection 156 for obtaining (e.g., reading) output data from the IC. IC 100 preferably includes a test memory output 157 for accessing data stored in test memory 140. Control signals supplied to control connection 154 may comprise, by way of example only and without limitation, an IC enable signal, a signal initiating BIST operation, a signal initiating transfer of BIST results to test memory 140, a signal controlling programming of test memory 140, or other signals operative to control one or more functions of IC 100.

Logic block 110 and memory block 120 are preferably coupled together and may form at least part of a larger functional block 125 in IC 100 and may function in accordance with an intended operation of the IC. Logic block 110 may perform at least part of one or more functions of the IC 100, or it may function in support of memory block 120. Exemplary functions of the IC may include, but are not limited to, processing, logic, sorting, encoding, decoding, routing and memory functions. Logic block 110 may comprise, for example, random logic, a processor, programmable logic, non-programmable logic, application specific integrated circuit (ASIC) logic, gate array logic, etc. Memory block 120 may perform storage and/or memory-related functions associated with an operation of the IC 100. Memory block 120 may comprise, for example, static random access memory (SRAM), DRAM, nonvolatile memory, such as, for example, read only memory (ROM), one time programmable (OTP) memory, few times programmable (FTP) memory, flash memory, phase-change memory (PCM), fuse memory, antifuse memory, etc. In an alternate embodiment, logic block 110 and/or memory block 120 is not utilized by the IC and hence may be omitted.

BIST block 130 is coupled to logic block 110 and/or memory block 120 and is operative to test one or more parameters of the IC 100 or a portion thereof. For example, BIST block 130 may be adapted to perform a burn-in or self-monitored burn-in test. BIST block 130 preferably tests logic block 110 and/or memory block 120 for failure modes, such as, for example, hold time or VHT failure modes in DRAM memory, or an inability of the IC 100 to execute an intended function. BIST block 130 may test the IC 100 multiple times (e.g., 3) as desired, within prescribed limitations of time and/or other constraints (e.g., average power dissipation) imposed on the IC 100 for performing such tests, or within a prescribed time interval needed to exercise the IC according to its intended function. An example of a BIST test, according to an embodiment of the invention, is a burn-in test or a self-monitored burn-in test. Results of BIST testing, as performed by BIST block 130, are transferred to and stored within test memory 140.

Test memory 140 is coupled to BIST block 130 and is operative to receive the results of BIST testing and to at least temporarily store said results. Test memory 140 comprises at least one storage element. A typical storage element can store one of two data states, indicative of a high voltage level (e.g., VDD) and a low voltage level (e.g., ground or 0 volt), and is therefore considered a binary storage element. Alternatively, a storage element may be adapted to store more than two states (e.g., three or more states). Test memory 140 preferably comprises one or more programmable nonvolatile storage elements, including, for example, fuse memory, anti-fuse memory, OTP, FTP, flash memory and PCM. In an alternative embodiment of the invention, test memory 140 comprises one or more programmable volatile storage elements, including, for example, SRAM or DRAM memory. In another embodiment, test memory 140 comprises one or more volatile storage elements and one or more nonvolatile storage elements. However, test memory 140 comprising only volatile memory has a disadvantage of requiring reading out of test results while the IC remains continuously powered up within the burn-in equipment, and the disadvantage of possibly losing test results due to power interruptions or test memory storage elements not functioning due to high temperature, high voltage, and/or other causes.

Various amounts and types of test result information can be stored in test memory 140. In one simple illustrative embodiment, only information indicating whether or not a failure occurred is stored in test memory 140. This can be done by a programming a single memory element within the test memory 140. For example, if a failure did not occur in the IC 100, the memory element may be programmed to, or retain the default programming of, a first binary state, which may be a logic "0." If a failure is detected in the IC, the memory element may be programmed to a second binary state, which may be a logic "1." Information indicating only failure or non-failure condition is significant. From failure/non-failure information, an overall failure rate for a sample of ICs undergoing burn-in can be obtained. More importantly, from failure/non-failure information, failing ICs can be harvested from the population of ICs undergoing burn-in.

Additional information can be transferred to and stored within test memory 140. Specifically, this additional information stored in test memory 140 may include, for example, information indicating the time of failure (e.g., either absolute or relative to a prescribed condition), type of failure, whether the failure is hard (i.e., consistently repeatable) or soft (i.e., intermittent), the parametric environment of the IC when the failure occurred (e.g., supply voltage, etc.), address of the failure, number of failures, and other information available from the BIST block 130.

Test memory 140 may be further operative to store information obtained from a circuit or other functional entity within IC 100 but outside of BIST block 130, such as, for example, temperature of the IC 100 when the failure occurred. In this case, temperature can be measured by a temperature sensor (e.g., current or voltage proportional to absolute temperature (PTAT) generator) within the IC, as will be understood by those skilled in the art; that is, the temperature sensor may reside on the semiconductor die, or on other components of a packaged IC device, such as the package molding compound (e.g., encapsulation). In the case of a multi-chip implementation (e.g., flip-chip, multi-chip module (MCM), etc.), the temperature sensor may reside on a different die than the BIST block 130. If the temperature sensor resides on a different die than the BIST block 130, it can be electrically coupled to the IC die by various connection techniques, such as, for example, wire bond, solder bumps, etc. In a similar manner, the voltage supply level of the IC may be measured by a voltage sensor residing on the IC 100 but outside of BIST block 130, although through test execution, the BIST block may already have knowledge of the IC voltage supply and may transfer this information directly to test memory 140. Subsequent to test memory 140 programming of BIST results, the results may be read in order to remove failing ICs, to calculate and compile failure statistics on the population of ICs undergoing burn-in, and/or to collect other information related to failures for subsequent analysis.

Figure 2:
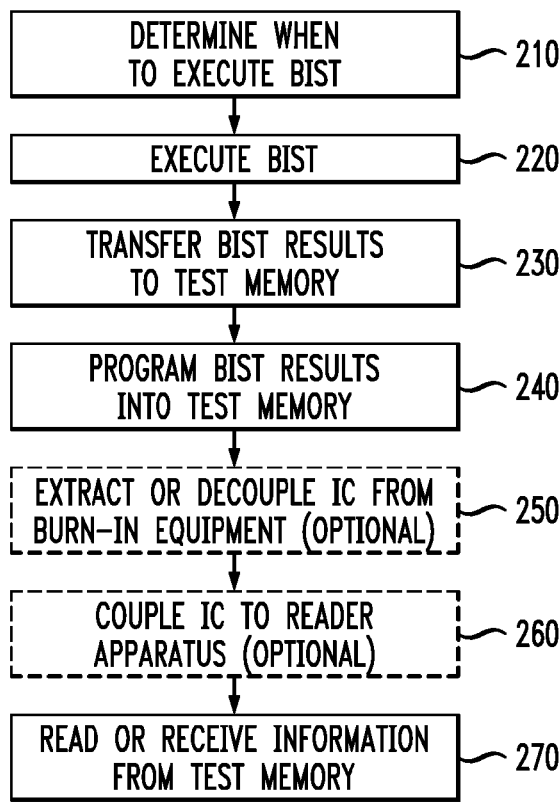
FIG. 2 is a flow diagram depicting an exemplary method of performing self-monitored burn-in, according to an embodiment of the present invention.

FIG. 2 is a flow diagram depicting an exemplary method 200 for performing self-monitored burn-in, according to an embodiment of the present invention. Although the illustrative method 200 comprises steps listed in order, the steps do not necessarily have to be performed in the specific order shown, but may be performed in an alternative order. Moreover, it is to be understood that although each step in the illustrative method 200 is depicted as being performed once, one or more steps may be performed multiple times, such as in a recursive loop or alternative arrangement. The invention is not limited to the number of times a given step is performed.

In step 210, a determination is made as to when to execute BIST. BIST may be performed only once, preferably at the end of burn-in or, more preferably, BIST may be performed a plurality of times during burn-in. Step 210 may be performed by circuitry inside the IC, for example, within logic block 110 or within circuitry external to logic block 110 (see FIG. 1). Alternatively, step 210 may be performed by apparatus or means external to the IC under test, for example, within burn-in equipment or ATE used for testing the IC. When step 210 is performed by apparatus or means outside of the IC, BIST can be controlled (e.g., started or stopped) using, for example, one or more control signals (e.g., control signal 154 in FIG. 1) supplied to the IC.

Once a determination has been made as to when to execute BIST, step 220 is operative to execute BIST; that is, the testing of the logic block 110 and/or the memory block 120 using BIST is initiated (see FIG. 1). In an alternate embodiment, BIST may be further operative to test one or more other functional components within the IC, such as, for example, BIST block 130, test memory 140 (see FIG. 1), and input/output circuitry (not shown). BIST testing may include, for example, a burn-in or a self-monitored burn-in test.

In step 230, BIST results are transferred to memory (e.g., test memory 140 in FIG. 1) in preparation for subsequently programming BIST results into the test memory. Transferring BIST results to the test memory in step 230 can occur under control of BIST block 130 (FIG. 1), or under control of an external control signal, for example, one of the one or more control signals 154 supplied to the IC 100 shown in FIG. 1, or an external control signal from the burn-in equipment.

In step 240, BIST results are programmed into the test memory (e.g., test memory 140 in FIG. 1). Programming BIST results in step 240, which preferably comprises writing or programming BIST results into one or more memory elements within the test memory, can be performed, for example, under control of the BIST block 130 (FIG. 1), or under control of an external control signal, for example, one of the one or more control signals 154 supplied to the IC 100 shown in FIG. 1, or an external control signal from the burn-in equipment. The term writing is typically associated with volatile memory, while the term programming is typically associated with non-volatile memory. In either case, however, BIST results are preferably stored within one or more memory elements (e.g., within the test memory 140 in FIG. 1) at the conclusion of each BIST execution. In an alternative embodiment, the BIST results are temporarily stored in memory not residing within the test memory, such as, for example, in SRAM or DRAM outside of the test memory, and then transferred to and programmed into the test memory 140 subsequently, for example, after the conclusion of all BIST testing. In this embodiment, the test memory 140 may be only programmed once during the course of burn-in.

Once BIST results have been programmed into the test memory in step 240, the IC under test is preferably extracted or decoupled from the burn-in equipment in step 250 and the IC is coupled to a reader apparatus, or alternative processor, in step 260 for subsequently reading or receiving information from the test memory in step 270 so that failing ICs can be collected from the overall population of ICs that underwent burn-in, and/or to obtain information relating to failures. For example, the information read from the test memory may include, but is not limited to, BIST results, temperature, voltage, and/or related information. The information stored in the test memory may be read by or transferred to the burn-in equipment or other reading apparatus coupled to the burn-in equipment. In this embodiment, the burn-in equipment or the reading equipment is adapted to read the test memory, or to receive test results or other information from the test memory, and therefore steps 250 and 260 may be omitted. In either case, step 270 is preferably performed while the IC under test remains within the burn-in equipment, although the information in the test memory may alternatively be read while the IC is not within the burn-in equipment. At least one of the one or more control signals 154 and the test memory output 155 (see FIG. 1) are preferably coupled to the burn-in equipment and/or the reading equipment.

In an illustrative embodiment, once the BIST results have been programmed into the test memory in a given IC (e.g., step 240), at least part of method 200 is repeated. For example, step 210, step 220, step 230, and step 240 may be repeated one or more times. In this way, BIST can be performed multiple times during burn-in, and BIST results stored within the test memory 140.

Figure 3:
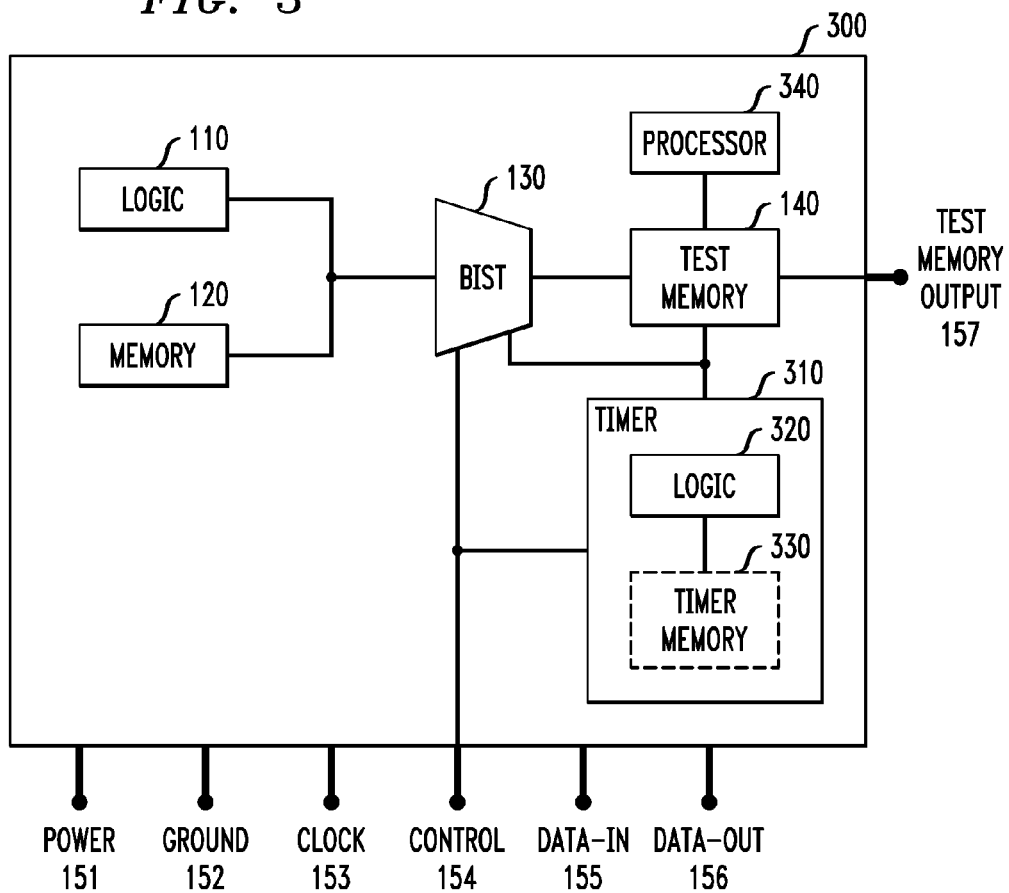
FIG. 3 is a block diagram depicting an exemplary IC comprising a timer operative to perform self-monitored burn-in, according to an embodiment of the present invention.

One approach for determining when to execute BIST in accordance with step 210, where circuitry within the IC performs the determination, involves the use of additional logic and additional programmable memory elements in the IC. FIG. 3 is a block diagram depicting an exemplary IC 300 comprising circuitry operative to perform self-monitored burn-in, according to an embodiment of the present invention. With reference to FIG. 3, IC 300 is similar to IC 100 shown in FIG. 1 in that IC 300 preferably includes all of the functional blocks of IC 100. Specifically, IC 300 includes a logic block 110, a memory block 120 coupled to the logic block, a BIST block 130 coupled to the logic and memory blocks, and a test memory block 140 coupled to the BIST block.

IC 300 further comprises a timer 310, or alternative controller circuit, operative to execute BIST functions at prescribed times or during prescribed time intervals and, optionally, to cause programming, at prescribed times or during prescribed time intervals, of one or more memory elements within test memory 140. Timer 310 preferably comprises timer logic 320 operative to measure one or more times and/or time intervals. At the end of the measured times or time intervals, BIST may be run (e.g., by BIST block 130) and, optionally, one or more memory elements within test memory 140 may be programmed.

Timer 310 may further optionally comprise timer memory 330 coupled to the timer logic 320. Timer memory 330 is preferably programmable, such as, for example, via one or more I/O connections of the IC 300 (e.g., Data-in 155, Data-out 156, etc.). Timer memory 330 may comprise programmable non-volatile memory, such as, for example, fuse memory, anti-fuse memory, OTP, FTP, flash memory, PCM and ROM. In an alternate embodiment, timer memory 330 may comprise programmable volatile memory, such as, for example, SRAM and DRAM memory. However, timer memory 330 comprising only volatile memory has a disadvantage of requiring programming of the timer memory after the IC has been powered up within the burn-in equipment.

In one aspect of the invention, the time intervals measured by timer 310 are set by programming timer memory 330. In this way, IC 300 can be programmed, prior to burn-in, to select when and how many times to run BIST, and to independently select when to program BIST results into test memory 140. For example, IC 300 may be adapted to run BIST and program BIST results into test memory 140 after 8, 16 and 32 hours of burn-in by programming timer memory 330. Alternatively, IC 300 may be adapted to run BIST after 8, 16 and 32 hours of burn-in, to remember BIST results from the various test time points, and to program BIST results into test memory 140 only after 32 hours of burn-in. It is to be understood that the invention is not limited to any specific time or time interval for executing BIST and/or for programming BIST results into the test memory.

In accordance with one aspect of the invention, BIST results programmed into test memory 140 may be internally processed subsequent to and/or during burn-in, such as, for example, by utilizing a processor 340, or alternative analysis means, included in IC 300. Processor 340, which is preferably coupled to test memory 140, may be operative to read or receive information stored in test memory 140 (e.g., to perform at least a portion of the methodologies of step 270 in method 300 shown in FIG. 3) and to perform, for example, further analysis (e.g., statistical analysis, etc.) on the BIST results, among other possible functions. Alternatively, BIST results programmed into test memory 140 can be externally processed subsequent to and/or during burn-in, such as, for example, by utilizing a processor (e.g., reader), or alternative ATE, external to the IC 300 or burn-in equipment.

Figure 4:
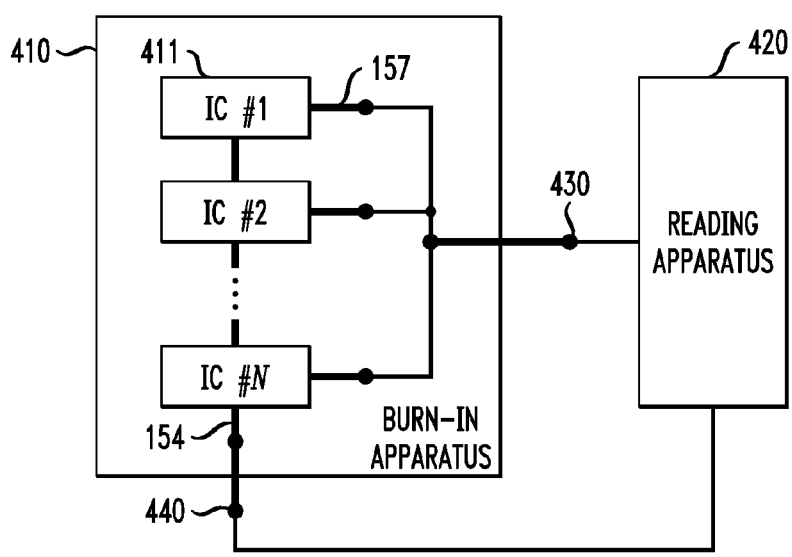
FIG. 4 is a block diagram depicting an exemplary system for reading a test memory, according to an embodiment of the present invention.

FIG. 4 is a block diagram depicting an exemplary system 400 for reading a test memory in an IC, according to an embodiment of the present invention. System 400 comprises burn-in apparatus 410 and reading apparatus 420, or alternative ATE, operatively coupled to the burn-in apparatus. Burn-in apparatus 410 preferably includes a plurality, N, of ICs 411 under test, where N is an integer greater than 1. Each of ICs 411 is operative to perform BIST and includes a test memory therein for storing BIST results and/or one or more parameters of the test environment (e.g., supply voltage, temperature, etc.). One or more of ICs 411 in burn-in apparatus 410 may be implemented in accordance with illustrative ICs 100 or 300 shown in FIGS. 1 and 3, respectively. ICs 411 preferably remain mounted within the burn-in apparatus 410 when the test memory 140 in each IC is read.

Reading apparatus 420 is coupled to burn-in apparatus 410 to facilitate reading of the test memory 140 in each of the ICs 411. Using system 400, steps 250 and 260 in the illustrative method 300 depicted in FIG. 3 may be omitted. System 400 advantageously allows the test memory 140 (FIG. 3) in each of the ICs 411 to be read, by reading apparatus 420 while remaining in the burn-in apparatus 410, without the need to remove the ICs from the burn-in apparatus. Furthermore, techniques of the invention beneficially eliminate the need for additional IC fixturing, such as, for example, mounting hardware or sockets, to hold the ICs in reading apparatus 420 when read. The test memory outputs 157 from the ICs 411 are coupled, through an output connection 430 of the burn-in apparatus 410, to reading apparatus 420. At least one of the one or more control signals 154 may be conveyed between reading apparatus 420 and ICs 411 in burn-in apparatus 410 through an I/O connection 440 of the burn-in apparatus. The at least one of the one or more control signals 154 are used by the reading apparatus 420 to control the test memory 140 in the ICs 411 when reading or receiving information from the test memory.

In an alternative embodiment, prior to reading or receiving information stored in the test memory (e.g., 140 in FIGS. 1 and 3), the ICs 411 are extracted or decoupled from the burn-in apparatus 410 (e.g., step 250 in FIG. 2) and coupled to reading apparatus 420 (e.g., step 260 in FIG. 2). At the time of reading, the external reading apparatus 420 is preferably coupled to test memory output 157 and at least one of the one or more control signals 154 of the ICs 411 (see FIGS. 1 and 3). At least one of the one or more control signals 154 is used to control the test memory in a given IC 411 in a read mode of operation.

Sometimes there may be a fault in the burn-in equipment or in the supply of power to an IC under burn-in testing. Furthermore, this fault may cause erroneous results to be programmed into the test memory (e.g., test memory 140 in FIGS. 1 or 3) of the IC. In accordance with an aspect of the invention, there are preferably adequate memory elements within the test memory to perform re-burn-in, recording results in additional memory elements in the test memory. In this embodiment, one or more memory elements in the test memory can be employed for indicating that data in previously programmed memory elements may be erroneous, and hence invalid.

At least a portion of the techniques of the present invention may be implemented in one or more integrated circuits. In forming integrated circuits, die are typically fabricated in a repeated pattern on a surface of a semiconductor wafer. Individual die are cut or diced from the wafer, then packaged as integrated circuits. In packaging the dies, individual die are attached to a receiving substrate according to methods of the invention. One skilled in the art would know how to dice wafers to produce integrated circuits. Integrated circuits so manufactured are considered part of this invention.

Figure 5:
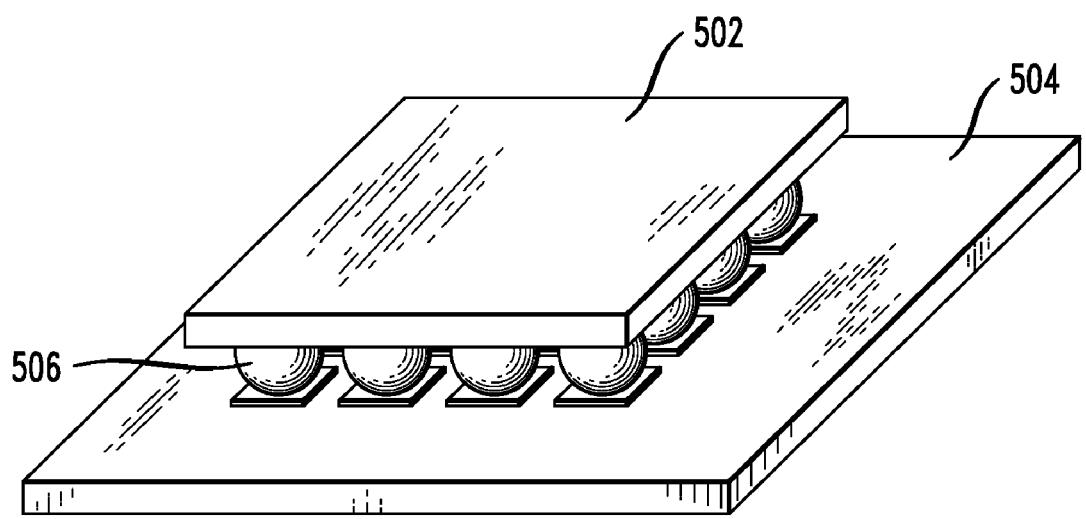
FIG. 5 is a perspective view depicting at least a portion of a semiconductor structure, formed according to an embodiment of the invention for implementing techniques of the present invention.

FIG. 5 is a perspective view depicting at least a portion of a semiconductor structure 500, formed according to an embodiment of the invention for implementing techniques of the present invention. The semiconductor structure 500 comprises a first integrated circuit die 502 and at least a second integrated circuit die 504 mechanically mounted proximate to and electrically interconnected with the first integrated circuit die in a known manner. Exemplary applications for this illustrative semiconductor structure include, but are not limited to, flip-chip and multi-chip module (MCM) technologies. The means of electrical interconnection contemplated by the invention is not limited and may include, for example, utilizing solder bumps, wire bonding, etc. For example, the first and second integrated circuit die used in the semiconductor structure may be electrically interconnected using a plurality of solder bumps 506, or alternative conductive structures, each solder bump being formed between a bonding site on the first integrated circuit die 502 and a corresponding bonding site on the second integrated circuit die 504, as will be understood by those skilled in the art.

By way of example only and without loss of generality, the first integrated circuit die 502 may include a processor (e.g., central processing unit (CPU), microprocessor, digital signal processor (DSP), etc.) and the second integrated circuit die 504 may include memory utilized by the processor. One or more of the integrated circuit die (502 and/or 504) includes a circuit adapted for self-monitored burn-in, according to an embodiment of the invention described herein. Semiconductor structures so manufactured are also considered part of this invention.

An integrated circuit formed in accordance with techniques of the present invention can be employed in essentially any application and/or electronic system. Suitable systems for implementing the invention may include, but are not limited to, personal computers, communication networks, portable communications devices (e.g., cell phones), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A packaged integrated circuit adapted for self-monitored burn-in, the packaged integrated circuit comprising:
    a first memory;
    at least one built-in self-test circuit coupled to the first memory and operative to test the packaged integrated circuit by executing a burn-in test and to generate test results indicative of at least one parameter of the burn-in test, wherein the test results are at least temporarily stored in the first memory as a function of a first control signal; and
    a controller circuit coupled to the built-in self-test circuit and operative to determine when to execute the burn-in test;
    wherein the controller circuit comprises a second memory, wherein information stored in the second memory is operative to control at least one of an execution time of the burn-in test and a transfer of at least a portion of the test results generated by the built-in self-test circuit to the first memory.

2. The integrated circuit of claim 1, further comprising a functional circuit adapted to perform one or more functions of the integrated circuit, and wherein the burn-in test is operative to evaluate operation of the functional circuit during at least a portion of a prescribed burn-in period.

3. The integrated circuit of claim 2, wherein the functional circuit comprises at least one of a logic circuit and a functional memory circuit.

4. The integrated circuit of claim 3, wherein the logic circuit comprises at least one of random logic, a processor, programmable logic, non-programmable logic, application specific integrated circuit logic, and gate array logic, and wherein the functional memory circuit comprises at least one of volatile memory, static random access memory, dynamic random access memory, non-volatile-memory, read only memory, one time programmable memory, few time programmable memory, flash memory, phase-change memory, fuse memory, and anti-fuse memory.

5. The integrated circuit of claim 1, wherein the controller circuit is further coupled to the first memory and operative to generate the first control signal for controlling when the test results are to be stored in the first memory.

6. The integrated circuit of claim 1, wherein at least one of the first memory and the second memory comprises at least one of programmable non-volatile memory, fuse memory, anti-fuse memory, one-time programmable memory, few-times programmable memory, flash memory, phase change memory, read only memory, programmable volatile memory, static random access memory, and dynamic random access memory.

7. The integrated circuit of claim 1, wherein the controller circuit is further operative to control at least one of execution of the burn-in test and storage of the test results in the first memory.

8. The integrated circuit of claim 1, wherein the first memory comprises at least one of programmable non-volatile memory, programmable volatile memory, fuse memory, anti-fuse memory, one time programmable memory, few time programmable memory, flash memory, phase change memory, static random access memory and dynamic random access memory.

9. The integrated circuit of claim 1, wherein the integrated circuit is adapted for connection to burn-in equipment during at least a portion of time the burn-in test is executed.

10. The integrated circuit of claim 1, wherein execution of the burn-in test is performed during the self-monitored burn-in and is operative to detect infant mortality failures and to lower post-burn-in failure of a population of integrated circuits comprising the integrated circuit.

11. The integrated circuit of claim 1, wherein the burn-in test is adapted to detect at least one of an intermittent failure and a variable-hold-time failure.

12. A method for self-monitored burn-in of a packaged integrated circuit, the method comprising the steps of:
    executing a burn-in test of the packaged integrated circuit to generate test results indicative of at least one parameter of the burn-in test; and
    at least temporarily storing at least a portion of the test results in a first memory in the packaged integrated circuit as a function of a first control signal, wherein the packaged integrated circuit comprises a built-in self-test circuit coupled to the first memory and operative to execute the burn-in test and a controller circuit coupled to the built-in self-test circuit and operative to determine when to execute the burn-in test;
    wherein the controller circuit comprises a second memory, wherein information stored in the second memory is operative to control at least one of an execution time of the burn-in test and a transfer of at least a portion of the test results generated by the built-in self-test circuit to the first memory.

13. The method of claim 12, further comprising determining when to execute the burn-in test and, in response to said determining, testing at least one functional component of the integrated circuit according to the burn-in test.

14. The method of claim 12, further comprising transferring results of the burn-in test to the first memory in response to at least one of the burn-in test and at least one control signal supplied to the integrated circuit.

15. The method of claim 12, further comprising programming the controller circuit in the integrated circuit for executing built-in self-test functions in the integrated circuit at prescribed times or during prescribed time intervals.

16. The method of claim 12, wherein the burn-in test is executed multiple times during burn-in to thereby monitor operation of the integrated circuit over a prescribed time period.

17. A method for self-monitored burn-in of a packaged integrated circuit, the method comprising the steps of:
    executing a burn-in test of the packaged integrated circuit to generate test results indicative of at least one parameter of the burn-in test;
    at least temporarily storing at least a portion of the test results in a first memory in the packaged integrated circuit as a function of a first control signal, wherein the packaged integrated circuit comprises a built-in self-test circuit coupled to the first memory and operative to execute the burn-in test;
    at least one of extracting and decoupling the integrated circuit from burn-in equipment to which the integrated circuit is coupled during the burn-in test; and
    coupling the integrated circuit to a processor adapted to receive information stored in the first memory.

18. An electronic system, comprising:
at least one packaged integrated circuit adapted for self-monitored burn-in, the at least one packaged integrated circuit comprising:
a first memory; and
at least one built-in self-test circuit coupled to the first memory and operative to test the packaged integrated circuit by executing a burn-in test and to generate test results indicative of at least one parameter of the burn-in test, wherein the test results are at least temporarily stored in the first memory as a function of a first control signal; and
a controller circuit coupled to the built-in self-test circuit and operative to determine when to execute the burn-in test;
wherein the controller circuit comprises a second memory, wherein information stored in the second memory is operative to control at least one of an execution time of the burn-in test and a transfer of at least a portion of the test results generated by the built-in self-test circuit to the first memory.

* * * * *